(12) United States Patent
Ren

(10) Patent No.: US 9,755,003 B2
(45) Date of Patent: Sep. 5, 2017

(54) SUBSTRATE AND DISPLAY DEVICE

(71) Applicant: BOE TECHNOLOGY GROUP CO., LTD., Beijing (CN)

(72) Inventor: Lijun Ren, Beijing (CN)

(73) Assignee: BOE Technology Group, Ltd., Beijing (CN)

(*) Notice: Subject to any disclaimer, the term of this patent is extended or adjusted under 35 U.S.C. 154(b) by 125 days.

(21) Appl. No.: 14/436,393

(22) PCT Filed: Sep. 20, 2014

(86) PCT No.: PCT/CN2014/087001
§ 371 (c)(1),
(2) Date: Apr. 16, 2015

(87) PCT Pub. No.: WO2015/192507
PCT Pub. Date: Dec. 23, 2015

(65) Prior Publication Data
US 2016/0300891 A1    Oct. 13, 2016

(30) Foreign Application Priority Data

Jun. 19, 2014   (CN) .......................... 2014 1 0277207

(51) Int. Cl.
*H01L 27/32*      (2006.01)

(52) U.S. Cl.
CPC ...... *H01L 27/3218* (2013.01); *H01L 27/3213* (2013.01); *H01L 27/3276* (2013.01)

(58) Field of Classification Search
CPC .. G02F 1/133609; G02F 2001/133613; G09G 2300/0452; G09G 2300/0456;
(Continued)

(56) References Cited

U.S. PATENT DOCUMENTS 9,257,068 B2 *   2/2016   Kim ....................... G09G 3/006
9,324,262 B2 *   4/2016   Kim ...................... G09G 3/3208
(Continued)

FOREIGN PATENT DOCUMENTS

| CN | 1652198 A | 8/2005 |
| CN | 101336443 A | 12/2008 |
| CN | 103794632 A | 5/2014 |

OTHER PUBLICATIONS

Dec. 1, 2014—International Search Report and Written Opinion with Eng Tran.

*Primary Examiner* — Caridad Everhart
*Assistant Examiner* — Ankush Singal
(74) *Attorney, Agent, or Firm* — Banner & Witcoff, Ltd.

(57) ABSTRACT

A substrate and a display device are provided. The substrate includes a plurality of pixel groups arranged in rows and columns, the pixel groups each include a 3×3 array of sub-pixels which are at least two red sub-pixels (R), at least two green sub-pixels (G), at least two blue sub-pixels (B) and one white sub-pixel (W) with the white sub-pixel (W) in the center of the 3×3 sub-pixel array. Sub-pixels of the pixel group constitute two pixel units, which share the white sub-pixel (W). Each pixel unit includes at least one red sub-pixel (R), at least one green sub-pixel (G), at least one blue sub-pixel (B) and one white sub-pixel (W). With this substrate, data volume and the number of outputting lines of a data chip can be reduced so as to simplify the structure of an array substrate or a color filter substrate.

17 Claims, 2 Drawing Sheets

(58) Field of Classification Search
CPC ... G09G 2320/0606; G09G 2320/0666; G09G 2340/06; G09G 2360/144; G09G 3/3406; G09G 3/3607
See application file for complete search history.

(56) References Cited

U.S. PATENT DOCUMENTS

| | | | | |
|---|---|---|---|---|
| 2004/0217694 | A1* | 11/2004 | Cok | G09G 3/3216 313/504 |
| 2007/0257946 | A1* | 11/2007 | Miller | G09G 3/2003 345/694 |
| 2008/0084376 | A1* | 4/2008 | Hirota | G09G 3/3607 345/88 |
| 2009/0135207 | A1* | 5/2009 | Tseng | G09G 3/3607 345/690 |
| 2010/0013848 | A1* | 1/2010 | Hekstra | G09G 3/20 345/589 |
| 2011/0043500 | A1* | 2/2011 | Kwak | G09G 3/006 345/206 |
| 2012/0268357 | A1* | 10/2012 | Shih | G09G 3/3607 345/88 |

* cited by examiner

SUBSTRATE AND DISPLAY DEVICE

The application is a U.S. National Phase Entry of International Application No. PCT/CN2014/087001 filed on Sep. 20, 2014, designating the United States of America and claiming priority to Chinese Patent Application No. 201410277207.3 filed on Jun. 19, 2014. The present application claims priority to and the benefit of the above-identified applications and the above-identified applications are incorporated by reference herein in their entirety.

TECHNICAL FIELD

At least one embodiment of the present invention relates to a substrate and a display device.

BACKGROUND

Compared with TFT-LCDs (Thin Film Transistor-Liquid Crystal Display), AMOLED (Active-Matrix Organic Light Emitting Diode) display screens have more advantages, such as requiring no backlight source, having a high response speed, a high contrast, a wide visual angle and low energy consumption, and capability of realizing flexible display, and therefore they have a great future in the field of flat panel displays.

SUMMARY

At least one embodiment of the present invention provides a substrate and a display device to reduce data volume and the number of outputs in a data chip so as to simplify the structure of an array substrate or a color filter substrate.

At least one embodiment of the present invention provides a substrate, which is an array substrate or a color filter substrate. The substrate includes a plurality of pixel groups arranged in rows and columns, and the pixel groups each include a 3×3 array of sub-pixels which are at least two red sub-pixels, at least two green sub-pixels, at least two blue sub-pixels and one white sub-pixel with the white sub-pixel in the center of the 3×3 sub-pixel array. Sub-pixels of the pixel group constitute two pixel units, which share the white sub-pixel. Each pixel unit includes at least one red sub-pixel, at least one green sub-pixel, at least one blue sub-pixel and one white sub-pixel.

At least one embodiment of the present disclosure provides a display device that includes the above-mentioned substrate.

BRIEF DESCRIPTION OF DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAIL DESCRIPTION

In order to make objects, technical details and advantages of the embodiments of the invention apparent, the technical solutions of the embodiments will be described in a clearly and fully understandable way in connection with the drawings related to the embodiments of the invention. Based on the described embodiments of the present invention, all other embodiments obtained by those of ordinary skill in the art without any creative effort are within the protection scope of the present invention.

In manufacturing of AMOLEDs, there are defects such as poor uniformity, threshold drift, low luminous efficiency and short service life etc. In view of this problem, the threshold deviation are compensated by means of an in-pixel compensating design (increasing the number of TFTs and the number of capacitors in a pixel) currently commonly used in the industry to improve the display uniformity of AMOLEDs.

However, the in-pixel compensating design used to compensate for the threshold deviation of AMOLEDs may reduce the aperture ratio of the pixels of the AMOLEDs and thus reduce the brightness of an AMOLED display screen. In view of this, a method of designing a pixel with sub-pixels of four colors RGBW has been proposed, in which a white sub-pixel is added to the original sub-pixels of three colors RGB to resolve the problem of brightness decrease of an AMOLED display screen. Meanwhile, in the pixel design method, the sub-pixel of the lowest grayscale value can be completely or partially replaced by a white sub-pixel through an algorithm so as to reduce the power consumption of a large-sized AMOLED panel.

The inventor of the present application has noted that, in the pixel design with sub-pixels of four colors RGBW, a white sub-pixel and a data line for writing grayscale voltages of the white sub-pixel are added to the original design in correspondence with each column of pixel units, which greatly increases data volume and the number of outputs of the corresponding data chip and thus not helpful for an array substrate or a color filter substrate to be simplified.

Embodiment 1

The embodiment of the present invention provides a substrate, which is an array substrate or a color filter substrate. The substrate includes a plurality of pixel groups arranged in rows and columns, each pixel group including a 3× (multiply) 3 array of sub-pixels which comprise at least two red sub-pixels, at least two green sub-pixels, at least two blue sub-pixels and one white sub-pixel with the white sub-pixel being in the center of the 3×3 sub-pixel array. Sub-pixels of a pixel group constitute two pixel units, which share the white sub-pixel. Each pixel unit includes at least one red sub-pixel, at least one green sub-pixel, at least one blue sub-pixel and one white sub-pixel.

Figure 1:
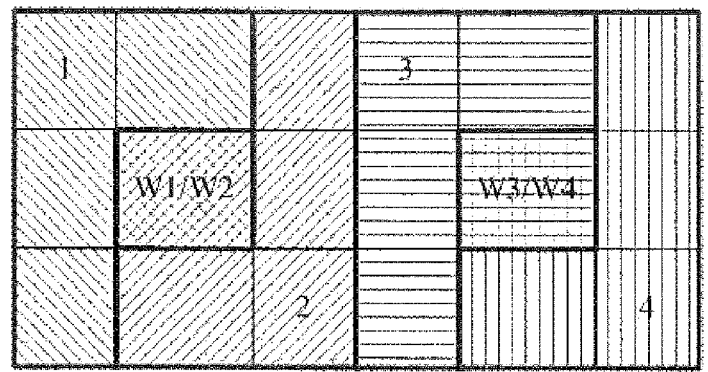
FIG. 1 is a structure diagram of pixel groups in a substrate in an embodiment of the present invention.

Referring to FIG. 1, four adjacent pixel units of the same row of pixel groups are labeled 1, 2, 3 and 4 (each area with the same pattern represents a pixel unit). Pixel units 1 and 2 constitute a pixel group and share one white sub-pixel W1/W2, while pixel units 3 and 4 constitute another pixel group and share one white sub-pixel W3/W4. Each sub-pixel of pixel units 1, 2 or pixel units 3, 4 occupies a position of the 3×3 sub-pixel array and the shared white sub-pixel W1/W2 or W3/W4 occupies the central position of the array.

Of course, each pixel unit should include at least one red sub-pixel, at least one green sub-pixel and at least one blue sub-pixel and have them arranged in positions other than the central one of the 3×3 sub-pixel array. It is to be noted that, the way that the pixel group is divided into pixel units as shown in FIG. 1 is only an optional one, and there may be many other dividing ways that can be used according to the design with sub-pixels of four colors RGBW in combination with the principle of liquid crystal display.

In order to illustrate the technical solutions of the embodiment of the present invention more clearly, the structure and display principle of the RGBW pixel unit will be briefly described at first.

Figure 2:
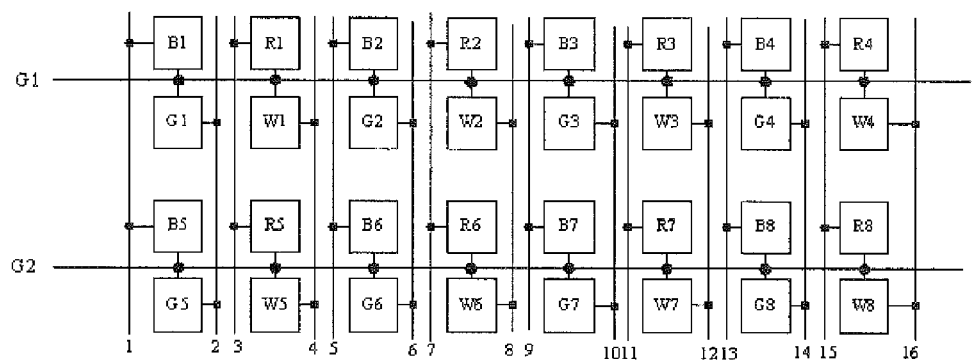
FIG. 2 is a structure diagram of pixel circuits in a substrate designed with sub-pixels of four colors RGBW.

Referring to FIG. 2, each pixel unit includes one red sub-pixel (R1, R2, . . . ), one green sub-pixel (G1, G2, . . . ), one blue sub-pixel (B1, B2, . . . ) and one white sub-pixel (W1, W2, . . . ). Given the values of a RGB function (for RGB, R=100, G=70, and B=50), the white sub-pixel will completely or partially take the place of the sub-pixel of the lowest grayscale, the blue sub-pixel with B=50 here. Consequently, assume W=m∈(0, 50], and let R=100-m; G=70-m; B=50-m. When m=50, the white sub-pixel will completely take the place of the blue sub-pixel. In this way, the display effect may be improved and the power consumption for display may be reduced.

In the embodiment of the present invention, since two pixel units share one white sub-pixel, accordingly the white sub-pixel may completely or partially take the place of the sub-pixel of the lowest grayscale for both of the pixel units. For example, when R1=100, G1=70 and B1=50 for RGB in one pixel unit and R2=40, G2=80 and B2=150 for RGB in the other pixel unit, assume W=m∈(0, 40] and let R1=100-m, G1=70-m, B1=50-m, R2=40-m, G2=80-m, B2=150-m.

Then in the substrate provided in the embodiment of the present invention, the number of white sub-pixels is halved and the number of data lines for writing grayscale voltages of the white sub-pixels is halved correspondingly, which is favorable for the structural simplification of an array substrate or a color filter substrate.

In an example, sub-pixels of pixel groups in the same row share the same gate line, i.e., all sub-pixels of the same row of pixel groups are connected to the gate line corresponding to this row and driven by the gate line driving signals corresponding to this row of pixel groups. This structure does not change the original operating pattern of an array substrate or a color filter substrate and is convenient for application.

In an example, for 3×3 sub-pixel arrays of pixel groups in the same column, sub-pixels of the same column of the same color share the same data line. That is, red sub-pixels, green sub-pixels, blue sub-pixels and white sub-pixels of pixel units of each column of pixel groups share their data lines respectively, and thus seven data lines are used for the pixel group arranged in the 3×3 sub-pixel array (two pixel units). Likewise, this structure does not change the original operating pattern of an array substrate and a color filter substrate and allows each sub-pixel of pixel units of each row of pixel groups to be written with grayscale voltages individually when being driven by a gate line driving signal.

In a different example, the pixel unit includes two red sub-pixels or two green sub-pixels, or includes a first blue sub-pixel and a second blue sub-pixel. This means that, in addition to a red sub-pixel, a green sub-pixel and a blue sub-pixel, the pixel unit further includes a sub-pixel to compensate for chrominance in the pixel unit. That is, each pixel group has eight positions other than the one for the white sub-pixel and four sub-pixels except for the white one can be provided in each pixel unit. Among the four positions for the four sub-pixels, one is occupied by a red sub-pixel, one by green, one by blue, and one is unoccupied. To improve display effect and prolong service life of sub-pixels for an array substrate or a color filter substrate, a sub-pixel (of predetermined color R/G/B) for chrominance compensation is disposed in the unoccupied position in each pixel unit in the 3×3 sub-pixel array of the pixel group.

In an example, each pixel unit includes a first blue sub-pixel and a second blue sub-pixel, i.e., a blue sub-pixel is added to double the total area of blue, so that the current required by each of the two blue sub-pixels is halved. Since the service life of a blue sub-pixel is in negative correlation with the current passing therethrough, the service life of the blue sub-pixel in this case can be prolonged, which is favorable for improvement of display effect and prolongation of service life for an array substrate or a color filter substrate.

In a different example, a pixel group includes a first pixel unit and a second pixel unit. In the 3×3 sub-pixel array, three sub-pixels in the 1st column, one sub-pixel in the 2nd column and the white sub-pixel constitute the first pixel unit, three sub-pixels in the 3rd column, one sub-pixel in the 2nd column and the white sub-pixel constitute the second pixel unit. Alternatively three sub-pixels in the 1st row, one sub-pixel in the 2nd row and the white sub-pixel constitute the first pixel unit, three sub-pixels in the 3rd row, one sub-pixel in the 2nd row and the white sub-pixel constitute the second pixel unit.

This design is about how to divide the 3×3 sub-pixel array into two pixel units (each pixel unit is assigned with four positions other than the central one of the 3×3 sub-pixel array). The dividing way described above takes into account comprehensively display characteristics of pixel units, arrangement of gate lines and data lines and consistency of the manufacturing process of the whole array substrate or color filter substrate, and thus is favorable for improvement of display effect and simplification of manufacturing process. It can be realized that the dividing way shown in FIG. 1 is also one of the ways for division of pixel units.

In an example, in the 3×3 sub-pixel array and in a from top to bottom sequence, the 1st column consists of the first blue sub-pixel, the green sub-pixel and the second blue sub-pixel of the first pixel unit; the 2nd column consists of the red sub-pixel of the first pixel unit, the shared white sub-pixel and the red sub-pixel of the second pixel unit; the 3rd column consists of the first blue sub-pixel, the green sub-pixel and the second blue sub-pixel of the second pixel unit.

Figure 3:
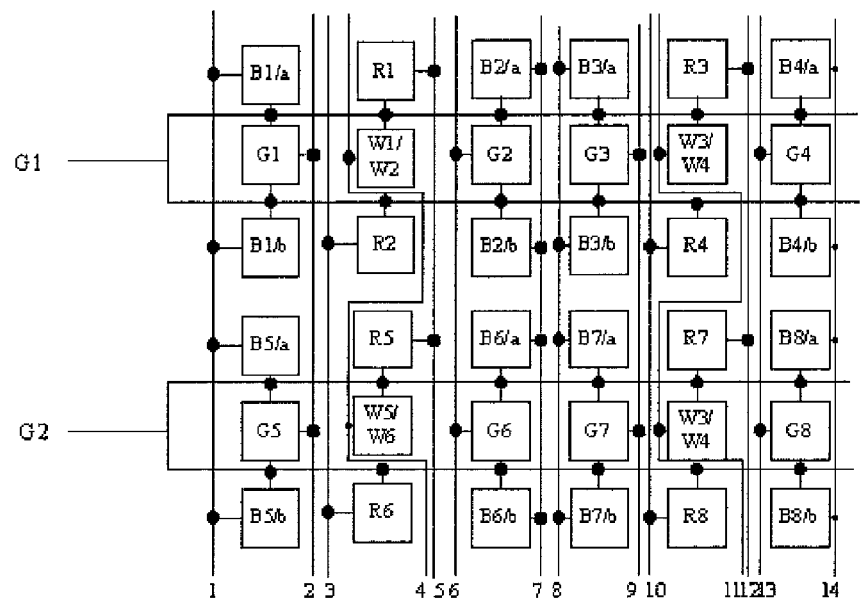
FIG. 3 is a structure diagram of pixel circuits in a substrate in an embodiment of the present invention.

The general arrangement in the above-mentioned case of the 3×3 sub-pixel array is shown in FIG. 3. Taking the top left pixel group as an example, the first pixel unit includes a first blue sub-pixel B1/*a*, a green sub-pixel G1, a second blue sub-pixel B1/*b*, a red sub-pixel R1 and a shared white sub-pixel W1/W2; the second pixel unit includes the shared white sub-pixel W1/W2, a red sub-pixel R2, a first blue sub-pixel B2/*a*, a green sub-pixel G2 and a second blue sub-pixel B2/*b*. Other pixel units can be designed in a similar way.

Furthermore, two gate lines G1, G2 corresponding to two rows of pixel groups respectively and 14 data lines, i.e., data lines 1 to 14, corresponding to sub-pixels of pixel units of each column of pixel groups respectively are connected as shown in FIG. 3. It can be seen that, when G1 signal is at the on-state and G2 signal is at the off-state, the G1 signal will drive each sub-pixel in each pixel unit of the corresponding row of pixel groups to be written with grayscale voltages; since sub-pixels of the same column of the same color in the 3×3 sub-pixel arrays of the same column of pixel groups share the same data line, they can be written with their own grayscale voltages individually. That is, when G1 is at a high level, Bi/a, Bi/b, Ri, Gi and Wi/W(i+1) [i=1 to 4] are written with data through data lines 1 to 14 and act to emit light; when G2 is at a high level, Bj/a, Bj/b, Rj, Gj and Wj/W(j+1) [j=5 to 6] are written with data through data lines 1 to 14 and act to emit light.

It can be seen that, every two pixel units (of the 3×3 sub-pixel array) require seven (7) data lines (seven lines for R1, G1, R2, G2, W1/W2, B1/*a* and B1/*b*, and B2/*a* and B2/*b* respectively), which are favorable for structural simplification of an array substrate or a color filter substrate.

Furthermore for the substrate in this configuration, factors, such as the display effect when two blue sub-pixels are lit (emit light) simultaneously, the color mixing effect when sub-pixels of various colors are lit simultaneously, the process and structure of a whole substrate arranged with the pixel group as a basic unit and the display effect when adjacent pixel units are lit simultaneously, are taken into consideration comprehensively to achieve a relatively superior resultant effect of display and a relatively simple technical process.

Embodiment 2

Figure 4:
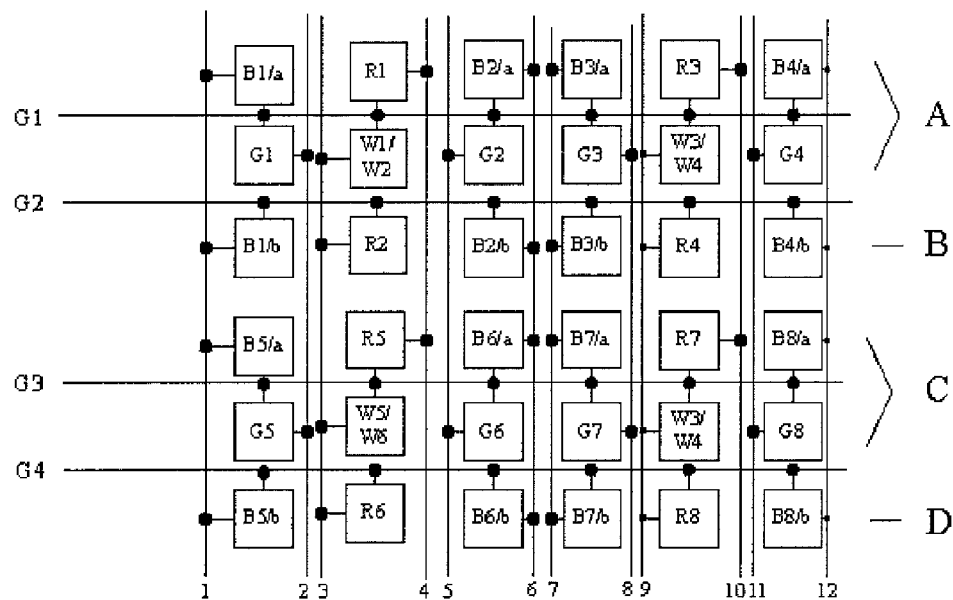
FIG. 4 is a structure diagram of pixel circuits in a substrate with an internal wiring configuration in an embodiment of the present invention.

This embodiment of the present invention provides a substrate, which, with reference to FIG. 4, is different from that provided in embodiment 1 in the following aspects.

All pixel units of the same row of pixel groups share a first gate line (e.g., G1 or G3) and a second gate line (e.g., G2 or G4); in the 3×3 sub-pixel arrays of the same row of pixel groups, sub-pixels of the first and second rows (sub-pixels in area A or C in the figure) share the first gate line, and sub-pixels of the third row (sub-pixels in area B or C in the figure) share the second gate line.

Meanwhile, in the 3×3 sub-pixel arrays in the same column of pixel groups, sub-pixels of the same column of the same color share one data line, while, in the 3×3 sub-pixel arrays in the same row of pixel groups, white sub-pixels (e.g., W1/W2, W3/W4, W5/W6 or W7/W8) and the second sub-pixels in the third row (e.g., R2, R4, R6 or R8) of the 3×3 sub-pixel arrays share one data line.

Taking the two pixel units of the 3×3 sub-pixel array of the top left pixel group shown in FIG. 4 as an example, B1/*a*, R1, B2/*a*, G1, W1/W2 and G2 share one (the first) gate line G1, while B1/*b*, R2 and B2/*b* share one (the second) gate line G2. Meanwhile, in each column, all sub-pixels of the same kind share one data line and moreover the white sub-pixels W1/W2 and red pixels R2 also share one date line.

The operating principle of the array is as follows:

When G1 is at a high level and G2 is at a low level, all sub-pixels in area A are turned on, charged through data lines 1 to 12 and thus lit, while all switching transistors in area B are turned off and illumination therein are stopped.

When G2 is at a high level and G1 is at a low level, all sub-pixels in area B are turned on, charged through data lines 1 to 12 and thus lit, while all switching transistors in area A are turned off and illumination therein are stopped.

Although W1/W2 and R2 share one data line, they are controlled by different gate lines so that either W1/W2 or R2 can be written with data at a moment. In these two operations, data on the 1st, 2nd, 4th and 5th data lines are all the same, but the 3rd data line will carry data for W1/W2 when G1 is at on-state and carry data for when G2 is at on-state. The operating principle for G3 and G4 is the same as that for G1 and G2.

It can be seen that, compared with that in embodiment 1, in this wiring manner, one data line is reduced with respect to every two columns of pixel units, while one gate line is added with respect to each row of pixel units. With comparison between the substrate in FIG. 2, the substrate of embodiment 1 (FIG. 3) and the substrate of embodiment 2 (FIG. 4), it can be seen that, with respect to every eight (8) pixel units, the substrate in FIG. 2 requires 16 data lines, the substrate in embodiment 1 requires 14 data lines, while the substrate in embodiment 2 only requires 12 data lines. In the substrate provided in embodiment 2, though one gate line is added, the number of data lines is reduced so that the area occupied by corresponding circuits can be reduced and thus the frame (rim) of the lower half can be narrowed.

Of course, the wiring manner shown in FIG. 4 is only one example for illustration. Alternatively, for example, sub-pixels of the second and third rows in the 3×3 sub-pixel array may share one gate line, while W1/W2 and R2 share one date line. For example, in the 3×3 sub-pixel arrays in the same row of pixel groups, sub-pixels of the second and third rows share a first gate line, while sub-pixels of the first row share a second gate line. Meanwhile, in the 3×3 sub-pixel arrays of the same column of pixel groups, sub-pixels of the same column of the same color share one data line; among the 3×3 sub-pixel arrays in the same row of pixel groups, each one has its white sub-pixel and the second sub-pixel in the first row share one data line. By this way, the same effect of reducing the number of data lines for every 8 pixel units up to 12 as that shown in FIG. 4 can be achieved.

Embodiment 3

Based on the same inventive conception, this embodiment of the present invention further provides a display device that includes any one of the above-mentioned substrates. The display device may be any product or component with a display function, such as an OLED panel, a mobile telephone, a flat computer, a TV, a display, a notebook computer, a digital picture frame, and a navigator.

Since the display device provided in the embodiment of the present invention has the same technical features as those of any of the above-mentioned substrates, the same technical problems can be resolved and the same technical effects can be achieved.

In summary, in embodiments of the present invention, a pixel area is divided into a plurality of pixel groups arranged in rows and columns with each pixel group including two pixel units which share one white sub-pixel, that is to say, one white sub-pixel located in the central position of the 3×3 sub-pixel array takes part in illumination of either of the two pixel units, and the corresponding algorithm is adjusted to be that the sub-pixel with the lowest grayscale of the pixel group is completely or partially replaced by the white sub-pixel to ensure normal illumination of the pixel units.

That is to say, in addition to ensuring the original fundamental functions, this configuration combines originally separate white sub-pixels of two pixel units into one sub-pixel, and thus reduces the volume of data for white sub-pixels in a data chip and also reduces the number of outgoing data lines for writing grayscale voltages by half, which is favorable for structural simplification of an array substrate or a color filter substrate.

Of course, the use of any of the products in embodiments of the present invention may not necessarily achieve all the above-mentioned advantages simultaneously.

It is to be noted that, as used herein, relationship terms such as "first", "second" etc. are only for the purpose of differentiating one entity or operation from another entity or operation, but it is not necessarily required or implied that those entities or operations have some physical relationship or order with respect to one another. Furthermore, terms "comprise", "include" or any of their derivatives are intended to cover containing non-exclusively, so that when to a process, a method, an article or a device comprising or including a series of elements is referred to, the process, method, article or device contains not only those stated elements but also other elements not listed expressly or inherent elements thereof. Without further limitation, when an element is qualified by the phrase "comprising one . . . ", "including one . . . " or any of their derivatives, it is not excluded that additional such elements exist in the process, method, article or device that contains the element.

The above embodiments only serve to explain the technical proposal of the present invention rather than limiting it; though the present invention has be described in detail with reference to the aforementioned embodiments, those of ordinary skill in the art should understand that they can still make modifications to the technical proposal recited in the aforementioned various embodiments or make equivalent substitutions to partial technical features therein; and all these modifications or substitutions will not make the nature of respective technical proposals to depart from the spirit and scope of the technical proposals of embodiments of the present invention.

The present application claims priority of China patent application No. 201410277207.3 filed on Jun. 19, 2014, which is incorporated herein in its entirety by reference as a part of the present application.

The invention claimed is:

1. A substrate that is an array substrate or color filter substrate, wherein the substrate comprises a plurality of pixel groups arranged in rows and columns, and each of the plurality of pixel groups comprises a 3×3 sub-pixel array;
   each of the plurality of pixel groups comprises at least two red sub-pixels, at least two green sub-pixels, at least two blue sub-pixels, and one white sub-pixel, which is located in a center of the 3×3 sub-pixel array;
   sub-pixels of each of the plurality of pixel groups constitute two pixel units sharing the white sub-pixel, so that each of the pixel units comprises at least one red sub-pixel, at least one green sub-pixel, at least one blue sub-pixel, and one white sub-pixel; and
   in the plurality of pixel groups of a same column, sub-pixels of a same sub-column of a same color share one data line.

2. The substrate of claim 1, wherein, in the plurality of pixel groups of a same row, sub-pixels of three sub-rows share one gate line.

3. The substrate of claim 1, wherein in the plurality of pixel groups of a same row, sub-pixels of a first sub-row, and a second sub-row share a first gate line, while sub-pixels of a third sub-row share a second gate line; or
   sub-pixels of a second sub-row and a third sub-row share a first gate line, while sub-pixels of a first sub-row share a second gate line.

4. The substrate of claim 3, wherein
   in the plurality of pixel groups of a same row, in a case that the sub-pixels of the first sub-row and the second sub-row share the first gate line and the sub-pixels of the third sub-row share the second gate line, each of the plurality of pixel groups has its white sub-pixel share one data line with its second sub-pixel in the third sub-row; or
   in the plurality of pixel groups in a same row, in a case that the sub-pixels of the second sub-row and the third sub-row share the first gate line and the sub-pixels of the first sub-row share the second gate line, each of the plurality of pixel groups has its white sub-pixel share one date line with its second sub-pixel in the first sub-row.

5. The substrate of claim 1, wherein each of the pixel units comprises two red sub-pixels or two green sub-pixels.

6. The substrate of claim 1, wherein each of the pixel units comprises a first blue sub-pixel and a second blue sub-pixel.

7. The substrate of claim 6, wherein each of the plurality of pixel groups comprises a first pixel unit and a second pixel unit; and
   in the 3×3 sub-pixel array,
   three sub-pixels in a first sub-column, one sub-pixel in a second sub-column and the white sub-pixel constitute the first pixel unit, while three sub-pixels in a third sub-column, one sub-pixel in the second sub-column and the white sub-pixel constitute the second pixel unit, or
   three sub-pixels in a first sub-row, one sub-pixel in a second sub-row and the white sub-pixel constitute the first pixel unit, while three sub-pixels in a third sub-row, one sub-pixel in the second sub-row and the white sub-pixel constitute the second pixel unit.

8. The substrate of claim 7, wherein in the 3×3 sub-pixel array and in a top-down sequence:
   a first sub-column comprises the first blue sub-pixel, the green sub-pixel, and the second blue sub-pixel of the first pixel unit;
   a second sub-column comprises the red sub-pixel of the first pixel unit, the shared white sub-pixel, and the red sub-pixel of the second pixel unit; and
   a third sub-column comprises the first blue sub-pixel, the green sub-pixel, and the second blue sub-pixel of the second pixel unit.

9. A display device comprising the substrate of claim 1.

10. The substrate of claim 2, wherein each of the pixel units comprises two red sub-pixels or two green sub-pixels.

11. The substrate of claim 2, wherein each of the pixel units comprises a first blue sub-pixel and a second blue sub-pixel.

12. The substrate of claim 3, wherein each of the pixel units comprises two red sub-pixels or two green sub-pixels.

13. The substrate of claim 3, wherein each of the pixel units comprises a first blue sub-pixel and a second blue sub-pixel.

14. The substrate of claim 4, wherein each of the pixel units comprises two red sub-pixels or two green sub-pixels.

15. The substrate of claim 4, wherein each of the pixel units comprises a first blue sub-pixel and a second blue sub-pixel.

16. A substrate that is an array substrate or color filter substrate, wherein the substrate comprises a plurality of pixel groups arranged in rows and columns, and each of the plurality of pixel groups comprises a 3×3 sub-pixel array;
   each of the plurality of pixel groups comprises at least two red sub-pixels, at least two green sub-pixels, at least two blue sub-pixels, and one white sub-pixel, which is located in a center of the 3×3 sub-pixel array;
   sub-pixels of each of the plurality of pixel groups constitute two pixel units sharing the white sub-pixel, so that each of the pixel units comprises at least one red sub-pixel, at least one green sub-pixel, at least one blue sub-pixel and one white sub-pixel; and in the plurality of pixel groups of a same row, sub-pixels of at least two sub-rows share one gate line.

17. The substrate of claim 16, wherein, in the plurality of pixel groups of a same row, sub-pixels of three sub-rows share one gate line.

\* \* \* \* \*